(12) United States Patent
Gandolfi et al.

(10) Patent No.: US 10,333,525 B1
(45) Date of Patent: Jun. 25, 2019

(54) DIGITALLY-BASED TEMPERATURE COMPENSATION FOR A CRYSTAL OSCILLATOR

(71) Applicant: Marvell International Ltd., Hamilton (BM)

(72) Inventors: Gabriele Gandolfi, Siziano (IT); Giacomo Bernardi, Milan (IT); Marco Bongiorni, San Giovanni (IT); Michele Chiabrera, Pavia (IT); Vittorio Colonna, San Martino Siccomario (IT); Alberto Demarziani, Vigevano (IT); Stefano Marchese, Pavia (IT); Alessio Pelle, Pavia (IT); Francesco Rezzi, Cava Manara (IT); Alessandro Savo, Pavia (IT)

(73) Assignee: MARVELL INTERNATIONAL LTD., Hamilton (BM)

( * ) Notice: Subject to any disclaimer, the term of this patent is extended or adjusted under 35 U.S.C. 154(b) by 227 days.

(21) Appl. No.: 15/369,909

(22) Filed: Dec. 6, 2016

Related U.S. Application Data

(60) Provisional application No. 62/263,976, filed on Dec. 7, 2015.

(51) Int. Cl.
  *H03B 5/32* (2006.01)
  *H03L 1/02* (2006.01)
  (Continued)

(52) U.S. Cl.
  CPC .............. *H03L 1/022* (2013.01); *H03B 5/32* (2013.01); *H03L 1/02* (2013.01); *H03L 1/023* (2013.01);
  (Continued)

(58) Field of Classification Search
  CPC .... H03B 5/12; H03B 5/32; H03B 2200/0018; H03L 1/04; H03L 1/026; H03L 1/025;
  (Continued)

(56) References Cited

U.S. PATENT DOCUMENTS

| 4,453,834 A | 6/1984 | Suzuki et al. |
| 5,117,206 A * | 5/1992 | Imamura ................ H03L 1/026 257/312 |

(Continued)

FOREIGN PATENT DOCUMENTS

| CN | 1379942 A | 11/2002 |
| CN | 101541073 A | 9/2009 |

(Continued)

OTHER PUBLICATIONS

Nihon Dempa Kogyo Co. Ltd., "NX3225SA Crystal Unit", Data Sheet, 1 page, Nov. 14, 2011.

(Continued)

*Primary Examiner* — Arnold M Kinkead

(57) ABSTRACT

An apparatus includes a temperature sensor, a digitally-controlled capacitor and a processor. The temperature sensor is coupled to a crystal oscillator and configured to generate an input signal depending on a temperature of the crystal oscillator. The digitally-controlled capacitor is connected to the crystal oscillator and configured to receive a control signal and, based on the control signal, to control a frequency of an output signal generated by the crystal oscillator. The processor is configured to receive the input signal from the temperature sensor, to convert the input signal into the control signal based on parameters that characterize the crystal oscillator and the digitally-controlled capacitor, and to apply the control signal to the digitally-controlled capacitor.

18 Claims, 3 Drawing Sheets

(51) Int. Cl.
*H03L 1/04* (2006.01)
*H04W 88/02* (2009.01)

(52) U.S. Cl.
CPC .............. *H03L 1/025* (2013.01); *H03L 1/026* (2013.01); *H03L 1/04* (2013.01); *H03B 2200/0018* (2013.01); *H04W 88/02* (2013.01)

(58) Field of Classification Search
CPC ........... H03L 1/023; H03L 1/022; H03L 1/02; H04W 88/02
USPC ............ 331/158, 116 FE, 116 R, 177 V, 176
See application file for complete search history.

(56) References Cited

U.S. PATENT DOCUMENTS

| | | |
|---|---|---|
| 5,659,884 A | 8/1997 | Daughtry et al. |
| 5,757,244 A | 5/1998 | Nonaka et al. |
| 5,875,388 A | 2/1999 | Daughtry, Jr. et al. |
| 5,883,550 A | 3/1999 | Watanabe et al. |
| 5,953,648 A | 9/1999 | Hutchison et al. |
| 6,212,398 B1 | 4/2001 | Roberts et al. |
| 6,272,190 B1 | 8/2001 | Campana |
| 6,453,181 B1 | 9/2002 | Challa et al. |
| 6,463,266 B1 | 10/2002 | Shohara |
| 6,522,212 B1 | 2/2003 | Kodim |
| 6,636,121 B2 | 10/2003 | Barak et al. |
| 6,738,607 B2 | 5/2004 | Ashkenazi |
| 6,985,705 B2 | 1/2006 | Shohara |
| 7,221,921 B2 | 5/2007 | Maligeorgos et al. |
| 7,307,480 B2 | 12/2007 | Shiu et al. |
| 7,403,078 B2 | 7/2008 | Routama et al. |
| 7,466,209 B2 | 12/2008 | Babitch |
| 7,548,130 B2 | 6/2009 | Kobayashi |
| 7,728,684 B2 | 6/2010 | Tozer |
| 8,026,460 B2 * | 9/2011 | Ito .......................... H03L 1/028 219/210 |
| 8,031,024 B1 | 10/2011 | Zaslavsky |
| 8,731,119 B2 | 5/2014 | Ben-Eli |
| 8,742,863 B1 | 6/2014 | Zaslavsky |
| 9,113,475 B2 | 8/2015 | Ben-Eli |
| 9,289,422 B2 | 3/2016 | Ben-Eli et al. |
| 2002/0158693 A1 | 10/2002 | Soong et al. |
| 2003/0144020 A1 | 7/2003 | Challa et al. |
| 2005/0064818 A1 | 3/2005 | Assarsson et al. |
| 2005/0088314 A1 | 4/2005 | O'Toole et al. |
| 2005/0093638 A1 | 5/2005 | Lin et al. |
| 2006/0267703 A1 | 11/2006 | Wang et al. |
| 2007/0165594 A1 | 7/2007 | Heinle et al. |
| 2007/0178875 A1 | 8/2007 | Rao et al. |
| 2007/0188254 A1 | 8/2007 | Sutardja et al. |
| 2009/0195322 A1 | 8/2009 | Yan et al. |
| 2010/0112950 A1 | 5/2010 | Haartsen et al. |
| 2010/0331019 A1 | 12/2010 | Bhattacharjee et al. |
| 2011/0066297 A1 | 3/2011 | Saberi et al. |
| 2011/0092163 A1 | 4/2011 | Baurque |
| 2011/0176465 A1 | 7/2011 | Panta et al. |
| 2011/0261909 A1 | 10/2011 | Andgart et al. |
| 2011/0306315 A1 | 12/2011 | Subrahmanya et al. |
| 2012/0069800 A1 | 3/2012 | Soliman et al. |
| 2014/0301263 A1 | 10/2014 | Ji et al. |
| 2015/0091702 A1 | 4/2015 | Gupta et al. |
| 2015/0173039 A1 | 6/2015 | Rune et al. |
| 2016/0241189 A1 * | 8/2016 | Itasaka ................... H03B 5/368 |
| 2016/0262202 A1 | 9/2016 | Gershoni et al. |
| 2017/0117903 A1 * | 4/2017 | Fukuzawa ................ H03L 1/04 |
| 2017/0155393 A1 * | 6/2017 | Hattori ..................... H03B 5/32 |
| 2017/0163263 A1 * | 6/2017 | Kano ....................... G01K 7/00 |
| 2017/0194968 A1 * | 7/2017 | Yonezawa ............... H03L 1/026 |
| 2017/0194971 A1 * | 7/2017 | Yonezawa ............... H03L 7/095 |

FOREIGN PATENT DOCUMENTS

| | | |
|---|---|---|
| GB | 2368235 A | 4/2002 |
| WO | 0133870 A2 | 5/2001 |
| WO | 0247281 A1 | 6/2002 |
| WO | 2005099107 A1 | 10/2005 |

OTHER PUBLICATIONS

3GPP TS 36304., "3rd Generation Partnership Project;Technical Specification Group Radio Access Network; 20 Evolved Universal Terrestrial Radio Access (E-UTRA); User Equipment (UE) Procedures in Idle Mode", Release 12, version 12.4.0, 38 pages, Mar. 2015.

3GPP TS 25304., "3rd Generation Partnership Project;Technical Specification Group Radio Access Network;User Equipment (UE) procedures in idle mode and procedures for cell reselection in connected mode", Release 12, version 12.4.0, 58 pages, Dec. 2014.

3GPP TS 43.022., "3rd Generation Partnership Project;Technical Specification Group GSM/EDGE Radio Access Network;Functions related to Mobile Station (MS) in idle mode and group receive mode," Release 12, version 12.0.0, 24 pages, Aug. 2014.

3GPP TS 25.211, "3rd Generation Partnership Project; Technical Specification Group Radio Access Network; Physical channels and mapping of transport channels onto physical channels (FDD) (Release 6)", V6.10.0, Chapter 5, 35 pages Sep. 2009.

3GPP TS 25214, "3rd Generation Partnership Project; Technical Specification Group Radio Access Network; Physical layer procedures (FDD) (Release 6)", V6.11.0, Annex C, 6 pages, Dec. 2006.

Kanodia et al., "MOAR: A Multi-channel Opportunistic Auto-rate Media Access Protocol for Ad Hoc Networks", Proceedings to the First International Conference on Broadband Networks (Broadnets'04), pp. 600-610, Oct. 25-29, 2004.

U.S. Appl. No. 15/052,907 office action dated Aug. 11, 2017.

\* cited by examiner

XTO ELECTRICAL MODEL

DIGITALLY-BASED TEMPERATURE COMPENSATION FOR A CRYSTAL OSCILLATOR

CROSS-REFERENCE TO RELATED APPLICATIONS

This application claims the benefit of U.S. Provisional Patent Application 62/263,976, filed Dec. 7, 2015, whose disclosure is incorporated herein by reference.

FIELD OF THE DISCLOSURE

The present disclosure relates generally to oscillator circuits, and particularly to methods and systems for temperature compensation for a crystal oscillator.

BACKGROUND

Crystal oscillators are used in a wide variety of applications. For example, wireless communication terminals often use a crystal oscillator for clocking various subsystems of the wireless terminal such as a Global Positioning System (GPS), elements of the terminal receiver such as synchronization circuits and the like. In some applications, a stable clock frequency is required over varying operating conditions.

The description above is presented as a general overview of related art in this field and should not be construed as an admission that any of the information it contains constitutes prior art against the present patent application.

SUMMARY

An embodiment that is described herein provides an apparatus that includes a temperature sensor, a digitally-controlled capacitor and a processor. The temperature sensor is coupled to a crystal oscillator and configured to generate an input signal depending on a temperature of the crystal oscillator. The digitally-controlled capacitor is connected to the crystal oscillator and configured to receive a control signal and, based on the control signal, to control a frequency of an output signal generated by the crystal oscillator. The processor is configured to receive the input signal from the temperature sensor, to convert the input signal into the control signal based on parameters that characterize the crystal oscillator and the digitally-controlled capacitor, and to apply the control signal to the digitally-controlled capacitor.

In some embodiments, the processor is configured to receive the input signal by sampling the input signal at a first sampling rate and decimating the sampled input signal to a second sampling rate lower than the first sampling rate. In other embodiments, the processor is configured to convert the input signal into the control signal by estimating the temperature of the crystal oscillator using a sensor model of the temperature sensor that translates the input signal into temperature. In yet other embodiments, the processor is configured to convert the input signal into the control signal by translating the estimated temperature into a frequency deviation using a frequency-temperature model of the crystal oscillator.

In an embodiment, the processor is configured to estimate, based on the input signal, a frequency deviation of the crystal oscillator from a target frequency, and to translate the estimated frequency deviation into the control signal using a frequency deviation model of the crystal oscillator. In another embodiment, the temperature sensor includes a Negative Temperature Coefficient (NTC) resistor. In yet another embodiment, the digitally-controlled capacitor includes a two-dimensional (2D) capacitor array in a capacitive DAC.

In some embodiments, the processor is further configured to estimate one or more parameters that characterize the crystal oscillator, by setting the digitally-controlled capacitor, independently of the input signal, to multiple predefined different capacitance values at a same given temperature, and measuring multiple respective resulting frequency deviations from a target frequency of the crystal oscillator. In other embodiments, the parameters that characterize the crystal oscillator include at least capacitances of a series capacitor and a parallel capacitor of an electrical model of the crystal oscillator, and multiple coefficients of a polynomial that models a relationship between frequency deviation and temperature of the crystal oscillator. In yet other embodiments, the processor is configured to approximate a relationship between the control signal and the input signal by applying to the input signal two or more polynomial expressions in series.

In some embodiments, a mobile communication terminal includes the disclosed apparatus. In some embodiments, a chipset for processing signals in a mobile communication terminal includes the disclosed apparatus.

There is additionally provided, in accordance with an embodiment that is described herein, a method including receiving an input signal from a temperature sensor, coupled to a crystal oscillator, the input signal being dependent upon a temperature of the crystal oscillator. The input signal is converted into a control signal based upon parameters that characterize the crystal oscillator and a digitally-controlled capacitor, connected to the crystal oscillator. The control signal is applied to the digitally-controlled capacitor, for controlling a frequency of an output signal generated by the crystal oscillator.

The present disclosure will be more fully understood from the following detailed description of the embodiments thereof, taken together with the drawings in which:

DETAILED DESCRIPTION OF EMBODIMENTS

Figure 1:
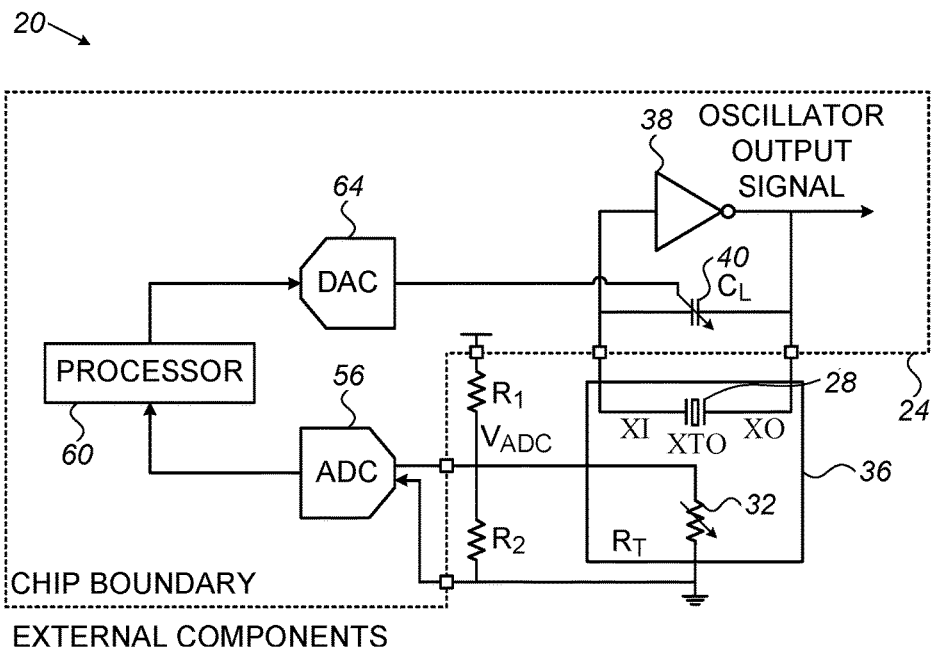
FIG. 1 is a block diagram that schematically illustrates a circuit implementing temperature compensation for a crystal oscillator, in accordance with an embodiment that is described herein.

In many applications, the frequency of a clock signal as generated, for example, by a crystal oscillator, needs to be kept within a narrow specified range. For example, a Global Positioning System (GPS) receiver operating within a wireless communication terminal may require a 26 MHz clock signal whose frequency should be kept within ±0.5 ppm deviation. In addition, errors in the output frequency of a given crystal oscillator, which are caused by temperature variations, should be kept within ±20 ppb (parts per billion) over a wide temperature range, e.g., between −40° C. and 80° C.

Most crystal oscillators, however, do not meet this accuracy specification, mainly due to frequency variations over temperature. For instance, the output frequency of typical AT-cut quartz crystal oscillators, which are commonly used in mobile and cellular telecommunication applications, may vary by as much as ±15 ppm over the required temperature range.

It is common practice to reach higher frequency accuracy in such applications by using Voltage-Controlled Temperature-Compensated Crystal Oscillators (VCTCXOs) having internal correction of temperature dependent frequency variations. VCTCXOs, however, are considerably more expensive than uncompensated crystal oscillators. Oscillator cost is a prime consideration, particularly in mass-production applications such as cellular phones.

Embodiments that are described herein provide improved methods and systems for temperature compensation of a crystal oscillator. In using these techniques, low-cost crystal oscillators that are supplied without compensation mechanisms, can be used in applications that require high frequency accuracy.

In the disclosed embodiments, a temperature compensation circuit comprises a temperature sensor packaged together with the crystal oscillator for directly measuring the crystal oscillator temperature. The circuit additionally comprises a digitally-controlled capacitor connected in parallel to the crystal oscillator for controlling the frequency of the oscillator output signal.

The circuit further comprises a processor, which is configured to receive digitized measurements from the temperature sensor and to translate these measurements into a control signal for the digitally-controlled capacitor, based on parameterized models of at least the crystal oscillator and digitally-controlled capacitor.

In some embodiments, the processor estimates the temperature of the crystal oscillator using a sensor model, which models the temperature as a function of the voltage on the temperature sensor, and translates the estimated temperature into a frequency deviation using a frequency-temperature model of the crystal oscillator, which models the frequency deviation of the crystal oscillator as a function of temperature. The processor further translates the estimated frequency deviation into the control signal using a frequency deviation model of the crystal oscillator, which models the output frequency as a function of the capacitance of the digitally-controlled capacitor.

The physical models of the temperature sensor, digitally-controlled capacitor, and crystal oscillator are typically highly non-linear, and by direct calculation would require the processor to perform complex calculations such as division and logarithmic functions. In some embodiments, the processor approximates the models using polynomials, which the processor calculates efficiently. Moreover, cascading several models in series provides flexibility to the design and implementation.

At least some of the parameters used in the above modeling may differ from one crystal oscillator to another. The crystal oscillator specifications provided by the manufacturer are typically insufficiently accurate, and the parameters need to be calibrated for each crystal oscillator individually.

In some embodiments, the processor calibrates one or more (e.g., three) parameters that characterize the crystal oscillator. The processor carries out the calibration by setting the digitally-controlled capacitor to three predefined different capacitance values at a same given temperature, and measuring three respective resulting frequency deviations from a target frequency of the crystal oscillator. The processor then estimates the three parameters by solving a respective system of equations in three variables. The processor may re-calibrate the three parameters adaptively, as required.

As described above, the disclosed methods and systems use parametrized models for compensating for temperature variations of the crystal oscillator. For example, modeling the frequency-temperature dependence of the crystal oscillator relies on the fact that different crystal oscillators belonging to a given type (e.g., AT-cut or other crystal cut geometry) tend to have similar frequency drifts as a function of temperature. The frequency offset (denoted ΔF or ΔF/F) as a function of temperature (denoted T) of a given oscillator type can be modeled by a certain mathematical dependence (e.g., a polynomial function). This dependence has one or more free parameters, whose values change from one specific oscillator to another. For example, the frequency-temperature dependence of AT-cut quartz crystal oscillators can be approximated as a $3^{rd}$ order polynomial of the form:

$$\frac{\Delta F}{F} = A_0 + A_1 \cdot (T - T_0) + A_2 \cdot (T - T_0)^2 + A_3 \cdot (T - T_0)^3 \quad \text{Equation 1}$$

In Equation 1, $T_0$ denotes a reference temperature for which $\Delta F/F = A_0$ (e.g., $T_0 = 25°$ C.), and $A_0, A_1, A_2$ and $A_3$ are free parameters that vary from one individual crystal oscillator to another. Other models used in the disclosed embodiments are described further below.

FIG. 1 is a block diagram that schematically illustrates a circuit 20 implementing temperature compensation for a crystal oscillator 28, in accordance with an embodiment that is described herein. Circuit 20 can be used in various applications such as, for example, in clocking a GPS receiver. Additional relevant applications include any applications, which require a highly precise and stable clock. These include, for instance, master and slave devices that synchronize respective clocks over a wired network or over an air interface, Bluetooth, user equipment on a cellphone network and various RF circuits, to name but a few examples.

Circuit 20 comprises an Integrated Circuit (IC) 24 that provides temperature compensation to a crystal oscillator 28, denoted XTO. In general, IC 24 senses variations in the temperature of the crystal oscillator and accordingly controls the frequency of the output signal generated by the crystal oscillator.

For measuring the temperature of the crystal oscillator directly, a temperature sensor 32 is coupled to the crystal oscillator in a common package 36. Alternatively, temperature sensor 32 may be in physical contact with the outside surface of package 36. Temperature sensor 32 may comprise any suitable type of temperature sensor such as thermo-resistor. In the present example, temperature sensor 32 comprises a Negative Temperature Coefficient (NTC) resistor, embedded within the crystal oscillator package. In alternative embodiments, temperature 32 is replaced by a temperature measurement circuit, such as described in U.S. Pat. No. 7,726,877, whose disclosure is incorporated herein by reference.

In some embodiments, the relationship between the resistance of sensor 32 and temperature is modeled as:

$$R_T = R_0 \cdot e^{-B\left(\frac{1}{T_0} - \frac{1}{T}\right)} \quad \text{Equation 2}$$

In Equation 2, $R_0$ is the sensor resistance at some reference temperature $T_0$, $R_T$ is the sensor resistance at temperature T, and B>0 is a non-negative exponential constant. As implied by Equation 2, as T increases above $T_0$, $R_T$ decreases below $R_0$, and vice versa. A typical NTC sensor is characterized by parameters such as, for example, $R_0$=100KΩ, $T_0$=300° K and B=4250, although other suitable values can also be used.

IC 24 comprises an inverter amplifier 38 and a digitally-controlled capacitor 40, both connected in parallel to the crystal oscillator.

Inverter 38 shapes the output signal of the oscillator into a square wave signal by allowing only two stable voltage levels at its output.

In an embodiment, capacitor 40 comprises a digitally-controlled capacitor. The control signal applied to capacitor 40 controls its capacitance $C_L$, thus determining the actual frequency of the output signal generated by crystal oscillator.

IC 24 further comprises a processor 60, e.g., a general purpose processor or a Digital Signal Processor (DSP), which receives temperature measurements (as voltage values) from temperature sensor 32 via an analog-to-digital converter (ADC) 56, and outputs a control signal to digitally-controlled capacitor 40 via a digital-to-analog converter (DAC) 64. Alternatively, a capacitive DAC can be used, as will be described in detail bellow.

The control loop managed by the processor compensates for frequency drift, e.g., due to temperature variations.

In the disclosed embodiments, processor translates the input signal received from the temperature sensor into a control signal for digitally-controlled capacitor 40 using parametrized models of at least the crystal oscillator and digitally-controlled capacitor, as will be described in detail below.

In the example of FIG. 1, voltage for operating temperature sensor 32 is supplied using a resistor network comprising resistors R1 and R2, connected in series to a voltage source denoted $V_{REF}$. The temperature sensor is connected in parallel to R2, and the voltage developing across the sensor resistance $R_T$ and R2 (denoted $V_{ADC}$) is input to ADC 56. Based on Equation 2 above, and taking the network of R1 and R2 into consideration, the temperature sensor is modelled as follows, in an embodiment:

$$T = \frac{B}{\ln\left[\frac{\frac{V_{ADC}}{V_{REF}}}{\frac{R_0}{R_1} - \frac{V_{ADC}}{V_{REF}} \cdot \frac{R_0}{R_P}}\right] + \frac{B}{T_0}} \quad \text{Equation 3}$$

wherein $R_P$ represents an equivalent resistance of R1 and R2 in parallel.

In some embodiments, some or all of the elements of circuit 20 in FIG. 1 are implemented in hardware, such as using one or more Field-Programmable Gate Arrays (FPGAs) or Application-Specific Integrated Circuits (ASICs). In an alternative embodiment, certain elements of circuit 20, such as certain elements of processor 60, are implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The circuitry configurations seen in FIG. 1 are example configurations, which are depicted solely for the sake of clarity. In alternative embodiments, any other suitable circuitry configurations can be used. Circuitry elements that are not mandatory for understanding of the disclosed techniques have been omitted from the figure for the sake of clarity.

In some disclosed embodiments, in addition to the models given in Equations 1 and 3 above, the temperature compensation process is additionally based on an electrical model of the crystal oscillator, as described herein.

Although in FIG. 1 DAC 64 and capacitor are depicted as separate components, in some embodiments, a capacitive DAC unit (not shown) is used instead. In some embodiments of this sort, the control signal from processor 60 is first converted by a first order SYNC up-sampler from a sampling rate of 40 KHz to a 26 MHz sampling rate. The up-sampler output is processed by a first order multibit sigma-delta modulator, which converts the 14 bit input into a 10 bit output, keeping the resolution of 15 bits in the signal frequency range, e.g., between 0.1 Hz and 4 KHz. The 10 bit output of the sigma delta modulator is used to drive a capacitor array, as described herein.

The 10 bit binary code corresponds to a 1024 bit thermometric code that can be used to derive a capacitor array of 1024 capacitors. In an embodiment, the 1024 capacitor array is organized in a 32λ32 two-dimensional matrix, which requires only 64 control lines instead of 1024. Switching each of the 1024 capacitors in and out requires the translation of the 10 bit binary code into a respective combination of thermometric row and column 5 bit codes.

In some embodiments, each of the array capacitors comprises a metal capacitor, also referred to as a Metal-Oxide-Metal (MOM) capacitor, having a capacitance of 12 femto-Farad (fF). The capacitor bottom plate is connected to ground potential via an NMOS switch whose gate is connected to row-column selection logic. The capacitor top plate is connected directly to the crystal oscillator pin.

Figure 2:
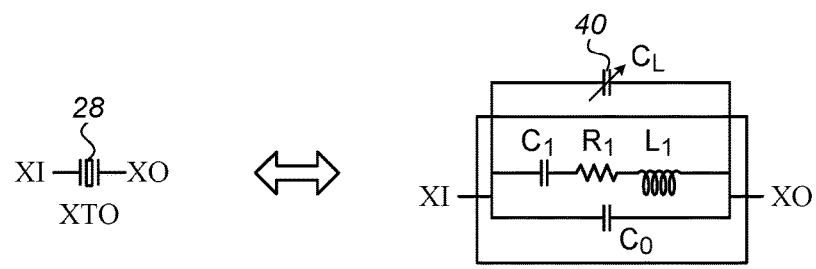
FIG. 2 is a diagram that schematically illustrates an electrical model of a crystal oscillator used in the circuit of FIG. 1, in accordance with an embodiment that is described herein.

FIG. 2 is a diagram that schematically illustrates an electrical model of a crystal oscillator (28), in accordance with an embodiment that is described herein. In FIG. 2, crystal oscillator 28 comprises a quartz crystal (e.g., an AT-cut type of crystal) that can be modeled as an electrical network with a parallel branch comprising a capacitor $C_0$, and a series branch comprising a capacitor $C_1$, a resistor $R_1$, and an inductor $L_1$. Digitally-controlled capacitor 40, which is external to crystal oscillator package 36, is connected in parallel to the crystal oscillator.

In the present example, the quartz crystal provides both series resonance and parallel resonance at about 26 MHz, wherein the series resonance frequency is a few KHz below the parallel resonance frequency. Equation 4 below depicts a model of the relationship between the parallel resonance frequency (denoted $F_A$) and the series resonance frequency (denoted $F_S$), including the capacitance $C_L$ of digitally-controlled capacitor 40:

$$F_A = F_S \cdot \left[1 + \frac{C_1}{2 \cdot (C_0 + C_L)}\right]$$ Equation 4

Note that the parallel resonance frequency $F_A$ is also the frequency of the crystal oscillator output signal. Equation 4 implies that given the crystal oscillator parameters $C_0$, $C_1$ and $F_S$, the output frequency $F_A$ can be determined by controlling the capacitance $C_L$.

Assume now that when the capacitance of the digitally-controlled capacitor is set to capacitance $C_L$ (via DAC 64), the parallel resonance frequency changes from $F_A$ to $F_A + \Delta F_L$. The relationship between the frequency offset $\Delta F_L$ and the capacitance required for causing this offset is given by:

$$C_L = \frac{C_1}{2 \cdot \left(\frac{F_A - F_S}{F_S} + \frac{\Delta F_L}{F_S}\right)} - C_0$$ Equation 5

The expression $(F_A - F_S)/F_S$ in equation 5 is a constant that expresses the difference between the series and parallel resonance frequencies. This constant may differ among crystal oscillators of the same type, but for a given crystal oscillator is independent of temperature.

Based on the models described above, we now describe a processing chain carried out digitally to implement temperature compensation for the crystal oscillator.

Figure 3:
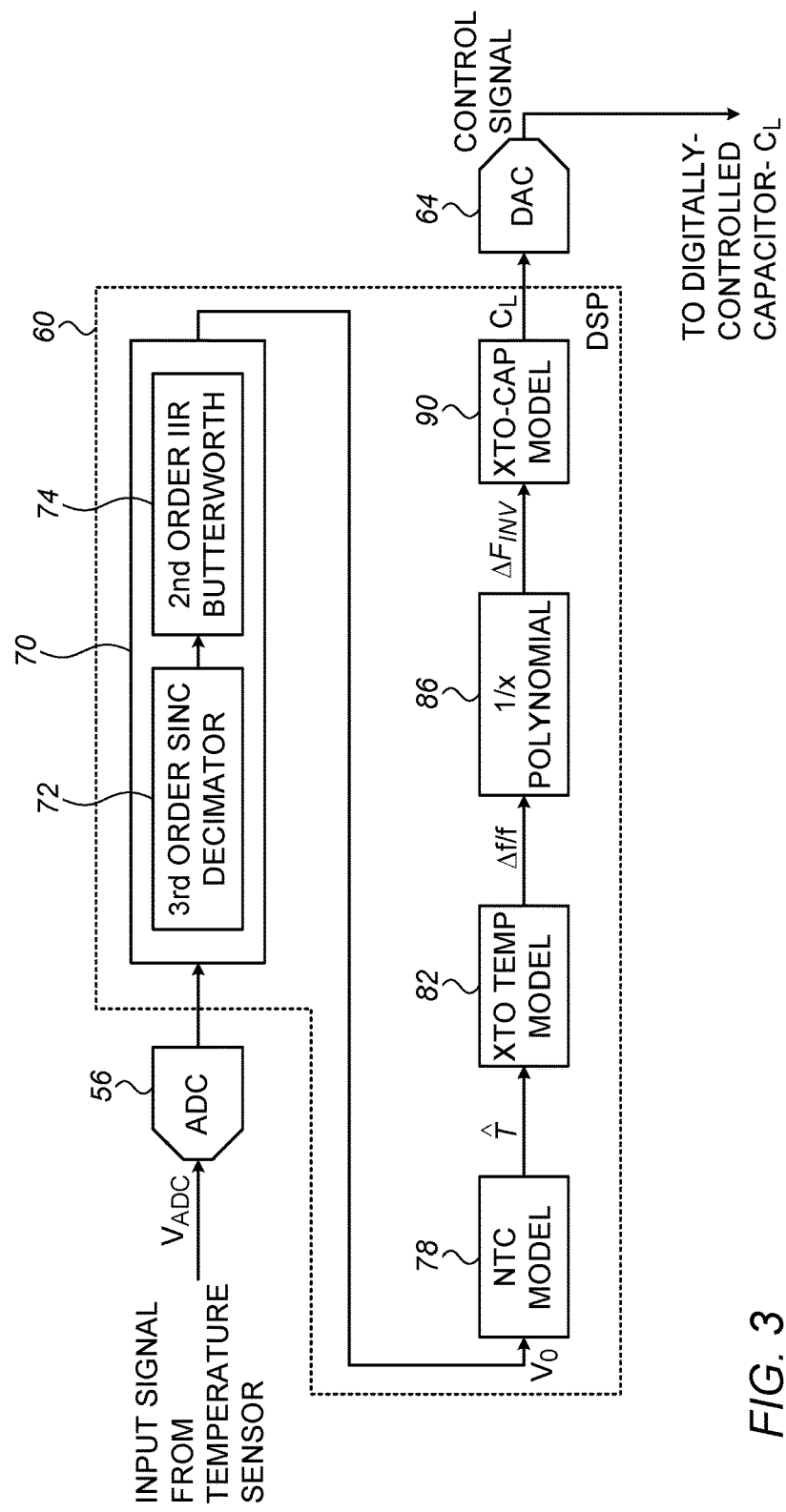
FIG. 3 is a diagram that schematically illustrates a digital processing chain for temperature compensation of the crystal oscillator in the circuit in FIG. 1, in accordance with an embodiment that is described herein.

FIG. 3 is a diagram that schematically illustrates a digital processing chain for temperature compensation of a crystal oscillator, in accordance with an embodiment that is described herein. The various stages of the processing chain of FIG. 3 are described as being executed by processor 60 of IC 24.

Processor 60 receives an input signal $V_{ADC}$ from temperature sensor 32, after being sampled and digitized by ADC 56. In an example embodiment, the sampling rate of ADC is 1 MHz, and the ADC converts the analog samples into digital samples of 12 bit resolution. Alternatively, the ADC may use other suitable sampling rate and/or other suitable bit resolution.

Since changes in temperature of the crystal oscillator typically vary slowly over time, it is advantageous to measure the temperature at a low sampling rate, and filter out noise present at high frequency bands. The processor therefore first down-samples the 1 MHz digitized input signal into a 40 KHz signal, using a down-sampling stage 70, which comprises a decimator 72 and a digital low pass filter 74. In the present example, decimator 72 comprises a $3^{rd}$ order SINC decimator, and filter 74 comprises a $2^{nd}$ order IIR Butterworth low pass filter, having a cutoff frequency of 700 Hz. In alternative embodiments, other types of suitable decimators and low pass filters can be used instead.

The processor next translates the output $V_0$ of down-sampling stage 70 into a temperature estimation $\hat{T}$, using a stage 78 that implements a parametrized model of the temperature sensor. Specifically, the temperature sensor is modeled using a 9th order polynomial approximation of the expression given in Equation 6, which is similar to the model in Equation 3 above, in which the down-sampled signal $V_0$ replaces $V_{ADC}$.

$$\hat{T} = \frac{B}{\ln\left[\frac{\frac{V_0}{V_{REF}}}{\frac{R_0}{R_1} - \frac{V_0}{V_{REF}} \cdot \frac{R_0}{R_P}}\right] + \frac{B}{T_0}}$$ Equation 6

Table 1, depicts an example $9^{th}$ order polynomial that approximates the sensor model of Equation 6, for $R_0 = 100K\Omega$, $T_0 = 300°$ K and B=4250. Additional, the polynomial corresponds to resistances $R1 = 274K\Omega$, $R2 = 820K\Omega$, and voltage $V_{REF} = 2V$, in FIG. 1.

TABLE 1

Example $9^{th}$ order polynomial modeling the temperature sensor

| Coefficient power | Coefficient value |
|---|---|
| COEFF-0 | −3306 |
| COEFF-1 | −3703 |
| COEFF-2 | 337 |
| COEFF-3 | −242 |
| COEFF-4 | 1626 |
| COEFF-5 | −6734 |
| COEFF-6 | −3325 |
| COEFF-7 | 12185 |
| COEFF-8 | 3508 |
| COEFF-9 | −10139 |

The processor next translates the estimated temperature $\hat{T}$ into frequency deviation $\Delta F/F$ using an XTO TEMP stage 82 that implements a frequency-temperature model, i.e., a $4^{th}$ order version of the polynomial in Equation 1, as given in Equation 7:

$$\frac{\Delta F_L}{F_S} = A_0 + \sum_{k=1}^{4} A_k \cdot (\hat{T} - T_0)^k$$ Equation 7

In the polynomial of Equation 7, $T_0 = 300°$ K, and $A_0 \ldots A_4$ are the model parameters. Note that the output of stage 82 represents the relative frequency deviation of the parallel resonance frequency of the crystal oscillator model of FIG. 2.

An example polynomial that implements Equation 7 is given in Table 2. Note that the actual polynomial may vary among different crystal oscillators of the same type.

TABLE 2

Example $4^{th}$ order polynomial that implements a frequency-temperature dependence of the crystal oscillator

| Coefficient power | Coefficient value |
|---|---|
| $A_0$ | 0 |
| $A_1$ | −3917 |
| $A_2$ | −1258 |
| $A_3$ | 12389 |
| $A_4$ | 0 |

In an inversion stage 86 of the processing chain, the processor uses a $5^{th}$ order polynomial to approximate an inverse function whose output is denoted $\Delta F_{INV}$ and is given by:

$$\Delta F_{INV} = \cfrac{1}{\cfrac{F_A - F_S}{F_S} + \cfrac{\Delta F_L}{F_S}} \qquad \text{Equation 8}$$

In Equation 8, $\Delta F_L/F_S$ is the output of the previous stage that depends (indirectly) on the temperature of the crystal oscillator, and $(F_A-F_S)/F_S$ is a constant that represents the difference between the series and parallel resonance frequencies of the crystal oscillator, as described above.

An example polynomial that implements the inverse function of stage 86 is given in Table 3.

TABLE 3

Example 5$^{th}$ order polynomial implementing an approximate inverse function

| Coefficient power | Coefficient value |
|---|---|
| COEFF-0 | −2225 |
| COEFF-1 | −7588 |
| COEFF-2 | 2055 |
| COEFF-3 | −557 |
| COEFF-4 | 169 |
| COEFF-5 | −47 |

The output $\Delta F_{INV}$ of stage 86 is input to an XTO-CAP model stage 90, which models the capacitance $C_L$ of digitally-controlled capacitor 40 as a function of $\Delta F_{INV}$. Based on Equation 5 above, the model in stage 90 comprises a 1$^{st}$ order polynomial of the form:

$$C_L = \frac{C_1}{2} \cdot \Delta F_{INV} - C_0 \qquad \text{Equation 9}$$

The output of stage 90 is provided to DAC 64, which converts the output of stage 90 into an analog voltage for controlling digitally-controlled capacitor 40, thereby closing the temperature compensation control loop.

As described above, modeling the temperature sensor in stage 78 requires knowledge of the parameters $A_0 \ldots A_4$ of the polynomial in Equation 7. In addition, the XTO-CAP model used in stage 90 is defined by the parameters of the crystal oscillator $C_0$ and $C_1$, which are the coefficients of the 1$^{st}$ order polynomial of Equation 9.

Figure 4:
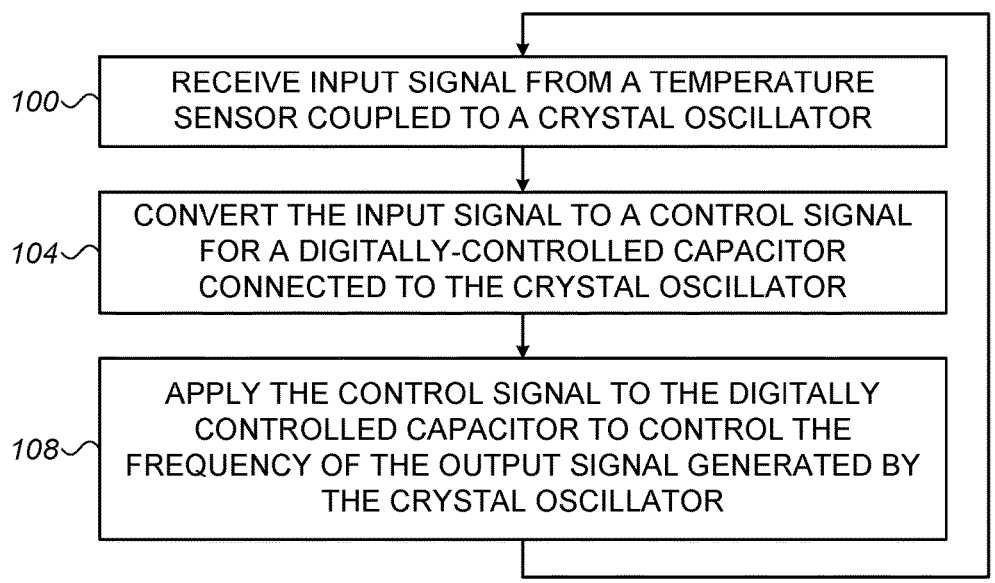
FIG. 4 is a flow chart that schematically illustrates a method for compensating for temperature variations of a crystal oscillator, using the digital processing chain of FIG. 3, in accordance with an embodiment that is described herein.

FIG. 4 is a flow chart that schematically illustrates a method for compensating for temperature variations of a crystal oscillator, using the digital processing chain of FIG. 3, in accordance with an embodiment that is described herein. The method is described as being executed by processor 60 of IC 24.

The method begins with processor 60 receiving an input signal from temperature sensor 32, at a reception operation 100. In some embodiments, the input signal provided by temperature sensor 28 comprises a voltage signal, which is indicative of the temperature of crystal oscillator 28. The voltage signal is sampled and digitized using ADC 56, as described above.

At a conversion operation 104, the processor converts the input signal to a control signal for digitally-controlled capacitor 40. In the present example, in performing this conversion, the processor applies to the input signal a digital processing chain, as described in FIG. 3. Alternatively, the processor may convert the input signal to the control signal using any suitable digital processing methods.

At a control operation 108, the processor applies the control signal derived at step 104 to digitally-controlled capacitor 40 so as to adapt the frequency of the output signal generated by the crystal oscillator in accordance with the measured temperature. Following operation 108 the method loops back to step 104, to receive subsequent samples of the input signal.

In the description that follows we describe a method for estimating the parameters $C_0$, $C_1$ and $A_0$ of the crystal oscillator by setting digitally-controlled capacitor 40 to three different capacitance values via the DAC, measuring the respective resulting frequency deviations, and solving a respective system of three equations in three variables. Note that all three measurements are taken at the same temperature, e.g., room temperature.

The method begins with processor 60 setting digitally-controlled capacitor 40 to capacitance value $C_{L1}$ by setting a corresponding digital code D1 at the input of DAC 64. The processor measures the resulting frequency $F_1$ of the crystal oscillator, and calculates a frequency deviation from the target frequency $F_R$ as $dF_1=(F_1-F_R)/F_R$.

Similarly, the processor further sets digitally-controlled capacitor 40 to values $C_{L2}$ and $C_{L3}$ by setting the DAC input to respective digital codes D2 and D3, measures the resulting frequencies $F_2$ and $F_3$, and calculates respective frequency deviations $dF_2=(F_2-F_R)/F_R$ and $dF_3=(F_3-F_R)/F_R$. In some embodiments, the codes applied to the DAC are related as D2=D1+10, and D3=D1+20, although other suitable DAC inputs can also be used.

In accordance with Equation 5, the capacitance values $CL_1$, $CL_2$ and $CL_3$ are related to $dF_1$, $dF_2$ and $dF_3$ as given by:

$$\begin{cases} C_{L1} = \cfrac{C_1}{2 \cdot (A + dF_1)} - C_0 \\ C_{L2} = \cfrac{C_1}{2 \cdot (A + dF_2)} - C_0 \\ C_{L3} = \cfrac{C_1}{2 \cdot (A + dF_3)} - C_0 \end{cases} \qquad \text{Equation 10}$$

wherein A, $C_0$ and $C_1$ are unknown variables, and A is of the form:

$$A = \frac{(F_R - F_S)}{F_S} \qquad \text{Equation 11}$$

Note that in Equation 11, the target frequency $F_R$ is known (e.g., 26 MHz), but the actual series resonance frequency of the crystal oscillator $F_S$ is unknown, because the manufacturer reports only a typical value of the series resonance frequency and not the series resonance frequencies of individual crystal oscillators. Note also that because the three measurements are taken at the same temperature, A in Equation 10 is the same in all three Equations.

Processor 60 solves the system of equations given in Equation 10 to derive A as:

$$A = \frac{dF_2 - \alpha \cdot dF_1}{(\alpha - 1)} \qquad \text{Equation 12}$$

wherein α is given by:

$$\alpha = \frac{(C_{L3} - C_{L1}) \cdot (dF_2 - dF_3)}{(C_{L3} - C_{L2}) \cdot (dF_1 - dF_3)}$$ Equation 13

After calculating variable A of system equations in Equation 10, processor 60 calculates $C_1$ as:

$$C_1 = 2 \cdot \frac{(C_{L1} - C_{L2}) \cdot (A + dF_1) \cdot (A + dF_2)}{(dF_2 - dF_1)}$$ Equation 14 and then the processor calculates $C_0$ as:

$$C_0 = C_{L1} - \frac{C_1}{2 \cdot (A + dF_1)}$$ Equation 15

Now we derive the parameter $A_0$ of the temperature dependence of the crystal oscillator as given in Equation 1. This parameter expresses the difference between the series resonance frequency $F_{Si}$ of the crystal oscillator as reported by the manufacturer, and the actual series resonance frequency $F_S$ of the specific crystal oscillator at hand:

$$A_0 = \frac{F_{Si} - F_S}{F_S}$$ Equation 16

Note that Equation 16 can be derived from Equation 1, by setting $T=T_0$. Based on the series resonance frequency $F_{Si}$, which depends on the type of the crystal oscillator, we define $A_i$ as:

$$A_i = \frac{F_R - F_{Si}}{F_{Si}}$$ Equation 17

Using A of Equation 12 and $A_i$ of Equation 17, and using the approximation $F_S \approx F_{Si}$, the processor estimates $A_0$ as:

$$A_0 = A - A_i$$ Equation 18:

Note that if processor 60 calibrates $A_0$ at a temperature T different from $T_0$, the estimation of $A_0$ as given in Equation 18 includes a temperature dependence component as given in Equation 1.

Processor 60 may apply the method described above for calibrating $C_0$, $C_1$ and $A_0$ when circuit is initialized, or after replacing the crystal oscillator. Additionally, the processor may re-calibrate $C_0$, $C_1$, and/or $A_0$ occasionally, e.g., when the estimated temperature of the crystal oscillator is sufficiently close to the ambient temperature, or adaptively using a suitable criterion.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a temperature sensor, coupled to a crystal oscillator and configured to generate an input signal depending on a temperature of the crystal oscillator;
a digitally-controlled capacitor, which is connected to the crystal oscillator and is configured to receive a control signal and, based on the control signal, to control a frequency of an output signal generated by the crystal oscillator; and
a processor, which is configured to:
  receive the input signal from the temperature sensor;
  convert the input signal into the control signal based on parameters that characterize the crystal oscillator and the digitally-controlled capacitor, the parameters comprising at least capacitances of a series capacitor and a parallel capacitor of an electrical model of the crystal oscillator, and multiple coefficients of a polynomial that models a relationship between frequency deviation and temperature of the crystal oscillator; and
  apply the control signal to the digitally-controlled capacitor.

2. An apparatus, comprising:
a temperature sensor, coupled to a crystal oscillator and configured to generate an input signal depending on a temperature of the crystal oscillator;
a digitally-controlled capacitor, which is connected to the crystal oscillator and is configured to receive a control signal and, based on the control signal, to control a frequency of an output signal generated by the crystal oscillator; and
a processor, which is configured to:
  receive the input signal from the temperature sensor by sampling the input signal at a first sampling rate and decimating the sampled input signal to a second sampling rate lower than the first sampling rate;
  convert the input signal into the control signal based on parameters that characterize the crystal oscillator and the digitally-controlled capacitor; and
  apply the control signal to the digitally-controlled capacitor.

3. The apparatus according to claim 1, wherein the processor is configured to convert the input signal into the control signal by estimating the temperature of the crystal oscillator using a sensor model of the temperature sensor that translates the input signal into temperature.

4. The apparatus according to claim 1, wherein the processor is configured to convert the input signal into the control signal by translating the estimated temperature into a frequency deviation using a frequency-temperature model of the crystal oscillator.

5. The apparatus according to claim 1, wherein the processor is configured to estimate, based on the input signal, a frequency deviation of the crystal oscillator from a target frequency, and to translate the estimated frequency deviation into the control signal using a frequency deviation model of the crystal oscillator.

6. The apparatus according to claim 1, wherein the temperature sensor comprises a Negative Temperature Coefficient (NTC) resistor.

7. The apparatus according to claim 1, wherein the digitally-controlled capacitor comprises a two-dimensional (2D) capacitor array in a capacitive DAC.

8. The apparatus according to claim 1, wherein the processor is further configured to estimate one or more parameters that characterize the crystal oscillator, by setting the digitally-controlled capacitor, independently of the input signal, to multiple predefined different capacitance values at a same given temperature, and measuring multiple respective resulting frequency deviations from a target frequency of the crystal oscillator.

9. The apparatus according to claim 1, wherein the processor is configured to approximate a relationship between the control signal and the input signal by applying to the input signal two or more polynomial expressions in series.

10. A wireless communication terminal comprising the apparatus of claim 1.

11. A chipset for processing signals in a wireless communication terminal, comprising the apparatus of claim 1.

12. A method, comprising:
receiving an input signal from a temperature sensor, coupled to a crystal oscillator, the input signal being dependent upon a temperature of the crystal oscillator;
converting the input signal into a control signal based upon parameters that characterize the crystal oscillator and a digitally-controlled capacitor, connected to the crystal oscillator, the parameters comprising at least capacitances of a series capacitor and a parallel capacitor of an electrical model of the crystal oscillator, and multiple coefficients of a polynomial that models a relationship between frequency deviation and temperature of the crystal oscillator; and
applying the control signal to the digitally-controlled capacitor, for controlling a frequency of an output signal generated by the crystal oscillator.

13. The method according to claim 12, wherein receiving the input signal comprises sampling the input signal at a first sampling rate and decimating the sampled input signal to a second sampling rate lower than the first sampling rate.

14. The method according to claim 12, wherein converting the input signal into the control signal comprises estimating the temperature of the crystal oscillator using a sensor model of the temperature sensor that translates the input signal into temperature.

15. The method according to claim 14, wherein converting the input signal into the control signal comprises translating the estimated temperature into a frequency deviation using a frequency-temperature model of the crystal oscillator.

16. The method according to claim 12, wherein converting the input signal into the control signal comprises estimating, based on the input signal, a frequency deviation of the crystal oscillator from a target frequency, and translating the estimated frequency deviation into the control signal using a frequency deviation model of the crystal oscillator.

17. The method according to claim 12, further comprising estimating one or more parameters that characterize the crystal oscillator by setting the digitally-control capacitor, independently of the input signal, to multiple predefined different capacitance values at a same given temperature, and measuring multiple respective resulting frequency deviations from a target frequency of the crystal oscillator.

18. The method according to claim 12, wherein converting the input signal into the control signal comprises approximating a relationship between the control signal and the input signal by applying to the input signal two or more polynomial expressions in series.

* * * * *